(12) United States Patent
Charton et al.

(10) Patent No.: US 8,470,140 B2
(45) Date of Patent: Jun. 25, 2013

(54) METHOD FOR THE PRODUCTION OF AN ULTRA BARRIER LAYER SYSTEM

(75) Inventors: Christoph Charton, Furth im Wald (DE); Matthias Fahland, Dresden (DE); Mario Krug, Neustadt/Sachsen (DE); Nicolas Schiller, Stolpen OT Helmsdorf (DE); Steffen Straach, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 2300 days.

(21) Appl. No.: 10/597,625

(22) PCT Filed: Nov. 23, 2004

(86) PCT No.: PCT/EP2004/013258
§ 371 (c)(1),
(2), (4) Date: Aug. 1, 2006

(87) PCT Pub. No.: WO2005/073427
PCT Pub. Date: Aug. 11, 2005

(65) Prior Publication Data
US 2007/0170050 A1    Jul. 26, 2007

(30) Foreign Application Priority Data
Feb. 2, 2004 (DE) .......... 10 2004 005 313

(51) Int. Cl.
*C23C 14/35* (2006.01)

(52) U.S. Cl.
USPC ........... 204/192.12; 204/192.15; 204/192.26; 204/192.27; 204/192.28

(58) Field of Classification Search
USPC ............. 204/192.12, 192.15, 192.26, 192.27, 204/192.28
See application file for complete search history.

(56) References Cited

U.S. PATENT DOCUMENTS

| | | | | |
|---|---|---|---|---|
| 4,619,865 A | * | 10/1986 | Keem et al. | 428/333 |
| 4,715,319 A | * | 12/1987 | Bringmann et al. | 118/723 E |
| 5,464,710 A | * | 11/1995 | Yang | 430/1 |
| 6,130,002 A | | 10/2000 | Neumann et al. | |
| 6,613,393 B1 | * | 9/2003 | Rauschnabel et al. | 427/488 |
| 2005/0040034 A1 | * | 2/2005 | Landgraf et al. | 204/192.38 |

FOREIGN PATENT DOCUMENTS

| | | |
|---|---|---|
| DE | 19548160 | 5/1997 |
| EP | 0815283 | 6/2002 |
| WO | 96/28587 | 9/1996 |
| WO | WO 99/63129 | * 12/1999 |
| WO | WO 03/048406 | * 6/2003 |

OTHER PUBLICATIONS

A.S. De Silva Sobrinho et al., "Transparent Barrier Coatings on Polytheylene Terephthalate by Single- and Dual-Frequency Plasma-Enhanced Chemical Vapor Deposition", J. Vac. Sci. Technology, A 16(6), pp. 3190-3198 (Nov./Dec. 1998).
R.J. Nelson et al., "Double-Sided QLF Coatings for Gas Barriers", Society of Vacuum Coaters, 34th Annual Technical Conference Proceedings, pp. 113-117, (1991).
M. Izu et al., "High Performance Clear Coat Barrier Film", Society of Vacuum Coaters, 36th Annual Technical Conference Proceedings, pp. 333-340 (1993).
A.G. Erlat et al., "Characterisation of Aluminum Oxynitride Gas Barrier Films", Thin Solid Films, vol. 338, pp. 78-86 (2001).
S. Schiller et al., "PVD Coating of Plastic Webs and Sheets with High Rates on Large Areas", Surface and Coatings Technology, vol. 125, pp. 354-360 (2000).
T.A. Miller et al., "Polymer Multi-Layer Processing of Thin Film Materials", 1999 Materials Research Society, Mat. Res. Soc. Symp. Proc., vol. 555, pp. 247-254.
J.D. Affinito et al., "Polymer-Oxide Transparent Barrier Layers", 1996 Society of Vacuum Coaters, 39th Annual Technical Conference Proceedings (1996) pp. 392-397.
S. Fujimaki et al., "New DLC Coating Method Using Magnetron Plasma in an Unbalanced Magnetic Field", Vacuum, vol. 59, pp. 657-664 (2000).
P.E. Burrows et al., "Ultra Barrier Flexible Substrates for Flat Panel Displays", Displays, vol. 22, pp. 65-69 (2001).
J.D. Affinito, "Hybridization of the Polymer Multi-Layer (PML) Deposition Process", Surface and Coating Technology 133-134, pp. 528-534 (2000).
J.D. Affinito et al., "High Rate Vacuum Deposition of Polymer Electrolytes", J. Vac. Sci. Technol. A 14(3), pp. 733-738 (May/Jun. 1996).

* cited by examiner

*Primary Examiner* — Rodney McDonald
(74) *Attorney, Agent, or Firm* — Greenblum & Bernstein, P.L.C.

(57) ABSTRACT

The invention relates to a method for producing an ultrabarrier layer system through vacuum coating a substrate with a layer stack that is embodied as an alternating layer system of smoothing layers and transparent ceramic layers, but comprising at least one smoothing layer between two transparent ceramic layers, which are applied by sputtering, in which during the deposition of the smoothing layer a monomer is admitted into an evacuated coating chamber in which a magnetron plasma is operated.

27 Claims, No Drawings

METHOD FOR THE PRODUCTION OF AN ULTRA BARRIER LAYER SYSTEM

FIELD OF THE INVENTION

The invention relates to a method for producing a transparent ultrabarrier layer system by vacuum coating.

BACKGROUND INFORMATION

Barrier layers are used to inhibit diffusion. They reduce permeation through a coated substrate. Frequent applications are found wherever the object is to prevent certain substances, e.g., foodstuffs as goods for packaging, from being able to come into contact with oxygen from the environment or water from being able to exchange with the environment. The primary focus is thereby on an oxidative reaction or perishability of the substances to be protected. In addition, i.a., the protection of various oxidation-susceptible substances when they are integrated into layer composites is also taken into consideration. The protection of these substances is of particular importance when retarding the oxidative reaction determines the life of products.

Barrier layers pose in part a very differing resistance to different diffusing substances. The permeation of oxygen (OTR) and water vapor (WVTR) under defined conditions through the substrate provided with the barrier layer is often cited to characterize barrier layers. Moreover, barrier layers often have the function of an electric insulating layer. Display applications represent an important field of application for barrier layers.

Through coating with a barrier layer, permeation through a coated substrate is reduced by a factor that can lie in the single-digit range or can be many orders of magnitude. Within the meaning of the invention, ultrabarrier layers are understood to be layers, the barrier effect of which prevents permeation values of WVTR=0.05 $g/m^2d$ and OTR=0.2 $cm^3/m^2d$ from being exceeded (WVTR according to DIN 53122-2-A; OTR according to DIN 53380-3).

In addition to preset barrier values, various other target parameters are often expected of a finished barrier layer. Examples thereof are optical, mechanical and technological-economic requirements. Barrier layers are often required to be invisible, therefore must be virtually completely transparent in the visible spectral range. If barrier layers are used in layer systems, it is often advantageous if coating steps for applying individual parts of the layer system can be combined with one another.

Cathode sputtering methods, so-called sputtering methods, have an important place among the coating methods that are used in the production of layer systems, since sputtering methods make it possible to deposit layers of high quality. It is therefore often desirable in the production of layer systems to be able to use sputtering methods at least in combination with other coating methods.

So-called PECVD methods (plasma-enhanced chemical vapor deposition) are often used to produce barrier layers. These are used for various substrates for different layer materials. It is known, for example, to deposit $SiO_2$ and $Si_3N_4$ layers of a thickness of 20 to 30 nm on 13 µm PET substrates [A. S. da Silva Sobrinho et al., J. Vac. Sci. Technol. A 16(6), November/December 1998, p. 3190-3198]. Permeation values of WVTR=0.3 $g/m^2d$ and OTR=0.5 $cm^3/m^2d$ can be achieved in this manner at an operating pressure of 10 Pa.

An oxygen barrier of OTR=0.7 $cm^3/m^2d$ can be realized with coating using $SiO_x$ for transparent barrier layers on PET substrate by means of PECVD [R. J. Nelson and H. Chatham, Society of Vacuum Coaters, 34th Annual Technical Conference Proceedings (1991), p. 113-117]. For transparent barrier layers on PET substrate, other sources on this technology also assume permeation values in the order of magnitude of WVTR=0.3 $g/m^2d$ and OTR=0.5 $cm^3/m^2d$ [M. Izu, B. Dotter, S. R. Ovshinsky, Society of Vacuum Coaters, 36th Annual Technical Conference Proceedings (1993), p. 333-340].

Disadvantages of the known PECVD methods lie above all in obtaining relatively low barrier effects. This makes the products unattractive for display applications in particular. Another disadvantage is the high operating pressure that is necessary to implement this method. If a coating step of this type is to be integrated into complex production processes in vacuum units, a high expenditure for pressure decoupling measures may be necessary. A combination with sputtering processes in particular is usually uneconomical for this reason.

It is known to apply barrier layers by sputtering. Sputtered individual layers often show better barrier properties than PECVD layers. For example, WVTR=0.2 $g/m^2d$ and OTR=1 $cm^3/m^2d$ are given as permeation values for sputtered AlNO on PET [Thin Solid Films 388 (2001) 78-86]. In addition, numerous other materials are known that are used to produce transparent barrier layers in particular through reactive sputtering. However, the layers thus produced likewise have barrier effects that are too low for display purposes. Another disadvantage of such layers is their low mechanical load capacity. Damage occurring through technologically unavoidable stresses during further processing or use mostly lead to a marked deterioration of the barrier effect. This makes sputtered individual layers often unusable for barrier applications.

It is known to vapor-deposit individual layers as barrier layers. Through this PVD method, different materials can likewise be deposited directly or reactively on various substrates. For example, the reactive vapor deposition of PET substrates with $Al_2O_3$ is known for barrier applications [Surface and Coatings Technology 125 (2000) 354-360].

Permeation values of WVTR=1 $g/m^2d$ and OTR=5 $cm^3/m^2d$ are hereby achieved. These values are likewise much too high to use such coated materials as barrier layers in displays. They are often even less loadable in mechanical terms than sputtered individual layers. Moreover, a direct vaporization is usually associated with a high vaporization speed or rate. With the production of thin layers customary in barrier applications, this requires correspondingly high substrate speeds in order to avoid the substrate being loaded too much A combination with process steps that require a much lower throughput speed is thus virtually impossible in continuous pass plants. This affects in particular the combination with sputtering processes.

It is known that the mechanical stability of inorganic vapor-deposited layers can be improved if an organic modification is carried out during vaporization. The integration of organic constituents into the inorganic matrix forming during the layer growth thereby occurs. Apparently, an increase in the elasticity of the entire layer occurs through the incorporation of these further constituents into the inorganic matrix, which markedly reduces the danger of fractures in the layer. A combination process that combines an electron-beam evaporation of $SiO_x$ with the admission of HMDSO is given in this context as an example of one suitable at least for barrier applications (DE 195 48 160 C1). However, low permeation rates necessary for display applications cannot be obtained with layers produced in this manner. Another drawback is that the electron-beam evaporation requires the high coating rates mentioned, which makes a combination with many other process steps much more difficult.

It is known to apply barrier layers in several coating steps. One method is the so-called PML process (polymer multi-layer) (1999 Materials Research Society, p. 247-254); [J. D. Affinito, M. E. Gross, C. A. Coronado, G. L. Graff, E. N. Greenwell and P. M. Martin, Society of Vacuum Coaters, 39th Annual Technical Conference Proceedings (1996), p. 392-397]. In the PML process a liquid acrylate film is applied to the substrate by means of vaporizers, which film is hardened by means of electron-beam technology or UV irradiation. This does not have a particularly high barrier effect per se. Subsequently, a coating of the hardened acrylate film takes place with an oxide intermediate layer onto which in turn an acrylate film is applied. This procedure is repeated several times as needed. The permeation values of a layer stack thus produced, i.e., a combination of individual acrylate layers with oxide intermediate layers, lies below the limit of measurement of conventional permeation measuring instruments.

There are disadvantages above all in the necessary use of complex systems engineering. It is imperative for vacuum units to operate according to the multi-chamber principle, which is associated with a high price. Moreover, first a liquid film forms on the substrate, which film has to be hardened. This leads to an increased soiling of the equipment, which shortens maintenance cycles. The process is likewise optimized for high line speeds and is therefore difficult to combine with slower coating processes, in particular with a sputtering process, in an in-line manner.

It is further known to use magnetron plasmas for a plasma polymerization in the deposit of diffusion barrier layers, i.e., barrier layers (EP 0 815 283 B1); [S. Fujimaki, H. Kashiwase, Y. Kokaku, Vacuum 59 (2000), p. 657-664]. These are PECVD processes that are directly maintained through the plasma of a magnetron discharge. An example of this is the use of a magnetron plasma for PECVD coating to deposit layers with a carbon skeleton, whereby $CH_4$ is used as a precursor. However, layers of this type likewise have insufficient barrier effect for display applications.

SUMMARY OF THE INVENTION

The object of the invention is to disclose a method for producing a transparent barrier layer system, the barrier effect of which is sufficiently high for the layer to be used in display applications, whereby the method should be compatible with the magnetron sputtering in terms of the coating speed and in terms of the vacuum requirements, thus easily combined in terms of systems engineering.

DETAILED DESCRIPTION

According to the invention, the object is attained through a method according to to the present application. Other advantageous embodiments of the method are to be found throughout the application.

The invention utilizes the properties of ceramic barrier layers. These show a dependency of the barrier effect on the layer thickness across a broad range of thicknesses. Tests have shown that, with the same overall thickness, a thick individual layer sometimes shows a markedly lower barrier effect than several thin partial layers that are separated from one another by other largely barrier-neutral intermediate layers. The reverse was not observed. It was further determined that, although a thinner individual layer shows a lower barrier effect than a thicker one, under mechanical stress the thinner layer does not lose its barrier effect until much greater stress or deformation than the thicker layer.

The barrier effect of ceramic layers is essentially determined by the defect density and the adhesion of the layer to the substrate or adjacent layers. The sometimes excellent barrier effect of layer stacks that contain several thin ceramic layers is apparently due to the fact that defects in the individual layers occur in a staggered manner. Wherever this is not the case, with the same overall thickness of the ceramic coating, the barrier effect of a layer stack increases only negligibly with respect to the barrier effect of a ceramic individual layer.

The method according to the invention is based on the alternating deposition of purely ceramic layers by magnetron sputtering and those layers that are deposited by means of an organometallic precursor that is reacted in a magnetron plasma.

The method for layer deposition by means of an organometallic precursor is based on the decomposition of a vaporous organometallic compound in a magnetron plasma, together with the deposition of an organically modified metal compound. The metal thereby has its origin in the organometallic compound, whereas other layer components both come from the organometallic compound and also additionally can be admitted in gaseous form.

The purely ceramic layers are applied by magnetron sputtering. This can occur in a reactive or non-reactive process.

It has been shown that, through layer deposition by means of an organometallic precursor, intermediate layers are formed that cause a particularly effective increase in the barrier effect of the ceramic layers. Apparently they have a structure that prevents the growth of defects in the ceramic layers from continuing over several layers. Thus, although new defects can form in each individual ceramic layer, which defects in some cases can extend through the entire thickness of the individual layer, the defect growth ends at the intermediate layer. Apparently, through the manner of the deposition of the intermediate layers, representing a PECVD method, a structure develops in the intermediate layers that is virtually independent of the structure of the substrate. Defects of a ceramic layer extending up to an intermediate layer do not lead to structural changes in the intermediate layer, which changes continue through the entire thickness of the intermediate layer. Defects in one ceramic layer located in a layer stack thus cannot initiate the defect growth in another ceramic layer. The intermediate layers lead to a smoothing of defective surfaces, which is why they are also referred to below within the meaning of the invention as smoothing layers. Through the statically determined displacement of the defects in the individual layers, permeation paths between the defects of two ceramic layers are considerably extended.

Another advantage of the method according to the invention lies in the fact that an excellent adhesion between the individual layers of the layer stack forming can be achieved through the application of the ceramic layers by sputtering. This leads to a further improvement of the barrier effect. Permeation values of WVTR =0.05 $g/m^2d$ and OTR=0.2 $cm^3/m^2d$ can already be achieved through a layer system comprising two transparent ceramic layers and one smoothing layer. The barrier effect can easily be adapted to preset minimum requirements by varying the number of individual layers. Even permeation rates that lie below the limit of measurement of conventional permeation measuring instruments can be obtained.

The invention relates to a method for producing an ultra-barrier layer system through vacuum coating a substrate with a layer stack that is embodied as an alternating layer system of smoothing layers and transparent ceramic layers, but comprising at least one smoothing layer between two transparent ceramic layers, which are applied by sputtering, whereby during the deposition of the smoothing layer a monomer is admitted into an evacuated coating chamber in which a magnetron plasma is operated. The deposition of both layer types of the alternating layer system thus takes place essentially respectively under the influence of a magnetron plasma. Both coating steps can thus be very easily combined in a vacuum unit, since the requirements of the vacuum make a complex pressure decoupling superfluous. The method can be operated in a particularly stable manner if a magnetron arrangement of one or more magnetrons is used in connection with a pulsed energy supply (1 kHz to 300 kHz) both for the deposition of the ceramic layer and for the deposition of the smoothing layer. This prevents on the one hand the increased formation of arc discharges and, on the other hand, the excessive coverage of the targets with reaction products from the coating process with the use of two or more targets and bipolar energy supply. Double magnetrons work particularly effectively in this manner, respectively one of which acts as a cathode and one as an anode and the polarity of which varies.

It is particularly advantageous if to maintain the magnetron plasma during the deposition of the smoothing layer a magnetron is used that is equipped with a target that is made of a material that can be reactively converted with nitrogen or oxygen, A magnetron of this type can thus be used by changing the gas admitted on the one hand with the admission of reactive gas to deposit transparent ceramic layers and on the other hand to support the plasma polymerization with monomer admission. In an advantageous embodiment of the method, the deposition of the alternating layer system takes place through the alternate admission of HMDSO and oxygen.

It is particularly advantageous if the maintenance of the magnetron plasma takes place independently of the admission of the gases to be converted. This is achieved through the additional admission of a working gas, preferably a noble gas. Argon can be used particularly advantageously for this. Hydrocarbons, silanes, Si-organics or organometallics have proven useful as monomers to be admitted according to the invention. The use of HMDSO has proven to be particularly advantageous, particularly if oxides are deposited as transparent ceramic layers.

Particularly good results are obtained if oxygen, nitrogen and/or hydrogen is admitted as reactive gas in addition to the admission of monomers during the deposition of the smoothing layer. A process pressure of 0.1 Pa to 10 Pa is advantageously set during the deposition of the smoothing layer, which makes this coating step easy to combine with sputtering processes. It is therefore particularly advantageous if the deposition of the transparent ceramic layers takes place through magnetron sputtering, preferably reactive magnetron sputtering, whereby nitrogen, oxygen and/or hydrogen is admitted as the reactive gas.

It is particularly advantageous to deposit $SiO_2$, $Al_2O_3$ or SiN as a transparent, ceramic layer.

The coating can be carried out on stationary or moving band-shaped substrates, which makes it possible to use the method in a versatile manner. It is particularly suitable for coating plastic substrates, in particular if the substrate temperature is kept at lower than 200° C., which is easily possible, e.g., via the adjustment of a corresponding plasma output. With the method according to the invention even extremely temperature-sensitive substrates can be coated without any damage at a still lower setting of the substrate temperature.

Particularly effective barrier systems can be obtained if the coating rates and/or the substrate speed are adjusted such that plasma polymer layers are deposited as smoothing layers with a layer thickness of 50 nm to 5 μm and transparent ceramic layers are deposited with a layer thickness of 5 nm to 500 nm.

Because the individual coating steps can be easily combined, it is possible to deposit all the individual layers under the influence of the plasma of a single magnetron arrangement. This makes it possible to use very compact equipment. It is hereby advantageous if during the deposition of the alternating layer system the flows of monomer and reactive gas and/or working gas admitted are gradually changed and at least at times occur simultaneously so that individual layers of the alternating layer system merge into one another in a gradient form. A particularly simple embodiment results if reactive gas and monomer are admitted via a common gas intake.

The method according to the invention can also be implemented advantageously if the alternating layer system is deposited by means of at least one magnetron arrangement and the admission of monomer and reactive gas and/or working gas takes place at different sites so that the layers of the alternating layer system are deposited successively when passing through the coating region on a moving substrate. It can thereby be particularly advantageous if the alternating layer system is deposited by means of at least one magnetron arrangement and the admission of monomer and reactive gas and/or working gas takes place at different sites so that a clear partial pressure gradient between the admitted gases develops in the region of the magnetron plasma such that when passing through the coating region on a moving substrate layers are successively deposited which merge into one another in a gradient form. The coating region can be passed through several times thereby in order to increase the number of individual layers. The combination of HMDSO and oxygen is also advantageous for embodiments of the method according to the invention with simultaneous admission of monomer and reactive gas. It can be expedient thereby to carry out the admission of reactive gas and working gas via a common gas intake.

The method according to the invention is explained in more detail on the basis of three exemplary embodiments.

In a first exemplary embodiment a plastic substrate arranged in a stationary manner is coated in a vacuum coating unit in a coating station. To this end an organometallic compound (HMDSO) in liquid form is placed in a storage vessel and fed via a flow controller to a vaporizer, where the liquid is vaporized. The vapor is admitted via a heated supply line and a likewise heated further flow controller into the process chamber previously evacuated and filled with Ar up to a pressure between 0.1 Pa and 10 Pa. In addition, other reactive gases such as oxygen or nitrogen can be admitted. All the gases are preferably admitted in the direct proximity of a magnetron plasma ignited in the process chamber. The plasma is generated by a double magnetron arrangement that is operated pulsed in bipolar fashion, whereby the pulse frequency is between 1 kHz and 100 kHz.

The targets of the magnetron are made of aluminum.

Firstly, oxygen is admitted. The aluminum targets are thus sputtered in a mixture of argon and oxygen, whereby a transparent ceramic layer ($Al_2O_3$) is applied in a reactive sputtering process. When a desired layer thickness is reached, the sputter rate is reduced and the oxygen admission is ended. Subsequently the admission of HMDSO takes place, whereby a smoothing layer is deposited under the influence of the magnetron plasma. When its desired layer thickness is reached, the admission of HMDSO is ended and then the reactive sputtering of an aluminum oxide layer takes place. This cycle is passed through several times if needed, until a required barrier effect can be expected. This can be verified by subsequent measurements.

With this type of stationary coating, through the selection of a suitable target material such as Si, Ti or Al, the application of an alternating layer system can take place in an analogous manner by simply changing the gases admitted between organometallic vapor and $O_2$ or $N_2$.

The advantage of this variant is that only one coating station is necessary, since the magnetron plasma is used once for the layer deposition of the ceramic layer and once for the conversion of the organometallic precursor.

In a second exemplary embodiment, a continuously moved plastic substrate is coated in at least one coating station in a vacuum coating unit that is equipped with a wind-off roll and a wind-up roll for band-shaped substrates. To this end a organometallic compound (HMDSO) in liquid form is placed in a storage vessel and fed via a flow controller to a vaporizer, where the liquid is vaporized. The vapor is admitted via a heated supply line and a likewise heated further flow controller into the process chamber previously evacuated and filled with Ar up to a pressure between 0.1 Pa and 10 Pa. In addition, other reactive gases such as oxygen or nitrogen can be admitted. All the gases are preferably admitted in the direct proximity of a magnetron plasma ignited in the process chamber. The plasma is generated by a double magnetron arrangement that is operated pulsed in bipolar fashion, whereby the pulse frequency is between 1 kHz and 100 kHz. The targets of the magnetron are made of aluminum.

The vacuum coating unit is operated with only one coating station. Firstly, oxygen is admitted. The aluminum targets are sputtered in a mixture of argon and oxygen, whereby a transparent ceramic layer ($Al_2O_3$) is applied in a reactive sputtering process. The layer thickness of the transparent ceramic layer can be adjusted via the feed rate of the band-shaped substrate and via the electric power fed to the sputtering process. When the desired length of the band-shaped substrate is coated, the coating process is interrupted and the band travel direction is reversed. Subsequently the admission of HMDSO takes place, whereby a smoothing layer is deposited under the influence of the magnetron plasma in the reverse band travel direction.

This cycle is passed through several times as needed with alternating band travel direction until a required barrier effect can be expected. This can be verified through subsequent measurements. In this manner layer stacks of as many individual layers as desired can be produced on elongated substrates in a single coating station.

In a third exemplary embodiment, a continuously moved plastic substrate is coated in several coating stations in a vacuum coating unit that is equipped with a wind-off roll and a wind-up roll for band-shaped substrates. The substrate is thereby successively guided past adjacent coating stations that are equipped according to the previous examples either for a reactive sputtering process for depositing $Al_2O_3$ or for a plasma-supported deposition of a smoothing layer according to the invention under the admission of HMDSO. If the number of coating stations corresponds to the number of the desired individual layers in the barrier system to be produced, this can be applied in a single pass through the coating unit. This results in a particularly high effectiveness of such units.

In all three exemplary embodiments, on the one hand the increased formation of arc discharges is prevented through the operation of the magnetron with a pulsed energy supply, on the other hand the excessive covering of the targets with reaction products from the coating process is reduced through the use of two targets and bipolar energy supply, which ensures a stable process control.

The invention claimed is:

1. Method for producing an ultrabarrier layer system comprising vacuum coating on a substrate a layer stack comprising an alternating layer system of at least one smoothing layer and transparent ceramic layers, and comprising the at least one smoothing layer between two transparent ceramic layers, which transparent ceramic layers are applied by sputtering, and a monomer is admitted into an evacuated coating chamber in which a magnetron plasma is operated during deposition of the at least one smoothing layer.

2. Method according to claim 1, wherein, during the deposition of the at least one smoothing layer, the magnetron plasma is operated in a pulsed manner with a pulse frequency of 1 kHz to 300 kHz.

3. Method according to claim 1, wherein, to maintain the magnetron plasma during the deposition of the at least one smoothing layer, a magnetron is used that is equipped with a target that is made of a material that can be reactively converted with nitrogen or oxygen.

4. Method according to claim 1, wherein a double magnetron is used to maintain the plasma during the deposition of the at least one smoothing layer.

5. Method according to claim 1, wherein a noble gas is used as a working gas.

6. Method according to claim 1, wherein hydrocarbons, silanes, Si-organics or organometallics are admitted as monomers.

7. Method according to claim 1, wherein at least one of oxygen, nitrogen and hydrogen is admitted as reactive gas in addition to the admission of monomers during the deposition of the at least one smoothing layer.

8. Method according to claim 1, wherein a process pressure of 0.1 Pa to 10 Pa is set during the deposition of the at least one smoothing layer.

9. Method according to claim 1, wherein the deposition of the transparent ceramic layers takes place through magnetron sputtering.

10. Method according to claim 9, wherein the deposition of the transparent ceramic layers takes place through reactive magnetron sputtering, and at least one of nitrogen, oxygen, and hydrogen is admitted as reactive gas.

11. Method according to claim 1, wherein $Al_2O_3$ is deposited as a transparent ceramic layer.

12. Method according to claim 1, wherein $SiO_2$ is deposited as a transparent ceramic layer.

13. Method according to claim 1, wherein SiN is deposited as a transparent ceramic layer.

14. Method according to claim 1, wherein the coating is performed on stationary substrates.

15. Method according to claim 1, wherein the coating is performed on moving band-shaped substrates.

16. Method according to claim 1, wherein the substrate temperature is kept at below 200° C. during the coating.

17. Method according to claim 1, wherein the coating is performed on plastic substrates.

18. Method according to claim 1, wherein at least one of coating rates and substrate speed is adjusted such that plasma polymer layers are deposited as smoothing layers with a layer thickness of 50 nm to 5 μm and transparent ceramic layers are deposited with a layer thickness of 5 nm to 500 nm.

19. Method according to claim 1, wherein the alternating layer system is deposited by a magnetron arrangement in the plasma of which alternately a monomer and a reactive gas is admitted.

20. Method according to claim 19, wherein the deposition of the alternating layer system takes place through alternating admission of HMDSO and oxygen.

21. Method according to claim 19, wherein, during the deposition of the alternating layer system, flows of monomer and reactive gas and/or working gas admitted are gradually changed and at least at times occur simultaneously so that individual layers of the alternating layer system merge into one another in a gradient form.

22. Method according to claim 19, wherein reactive gas and monomer are admitted via a common gas intake.

23. Method according to claim 1, wherein the alternating layer system is deposited by at least one magnetron arrangement and admission of monomer and reactive gas and/or working gas takes place at different sites so that the layers of the alternating layer system are deposited successively when passing through a coating region on a moving substrate.

24. Method according to claim 1, wherein the alternating layer system is deposited by at least one magnetron arrangement and admission of monomer and reactive gas and/or working gas takes place at different sites so that a clear partial pressure gradient between the admitted gases develops in the region of the magnetron plasma such that when passing through the coating region on a moving substrate layers are successively deposited which merge into one another in a gradient form.

25. Method according to claim 23, wherein the substrate comprises a moving substrate guided through the coating region several times.

26. Method according to claim 23, wherein the deposition of the alternating layer system takes place through the simultaneous admission of HMDSO and oxygen.

27. Method according to claim 23, wherein reactive gas and working gas are admitted via a common gas intake.

\* \* \* \* \*